(12) United States Patent
Ochi et al.

(10) Patent No.: US 8,031,127 B2
(45) Date of Patent: *Oct. 4, 2011

(54) SEMICONDUCTOR MEMORY MODULE INCORPORATING ANTENNA

(75) Inventors: Shozo Ochi, Osaka (JP); Hidenobu Nishikawa, Nara (JP); Hiroshi Sakurai, Osaka (JP)

(73) Assignee: Panasonic Corporation, Osaka (JP)

( * ) Notice: Subject to any disclaimer, the term of this patent is extended or adjusted under 35 U.S.C. 154(b) by 456 days.

This patent is subject to a terminal disclaimer.

(21) Appl. No.: 12/280,456

(22) PCT Filed: Mar. 28, 2007

(86) PCT No.: PCT/JP2007/056662
§ 371 (c)(1),
(2), (4) Date: Aug. 22, 2008

(87) PCT Pub. No.: WO2007/116790
PCT Pub. Date: Oct. 18, 2007

(65) Prior Publication Data
US 2009/0040734 A1  Feb. 12, 2009

(30) Foreign Application Priority Data
Apr. 3, 2006  (JP) .................. 2006-101740

(51) Int. Cl.
*H01Q 7/08* (2006.01)
(52) U.S. Cl. .................. 343/788; 343/700 MS; 343/866
(58) Field of Classification Search .................. 343/895, 343/700 MS, 741, 742, 866, 867, 787, 788; 235/492
See application file for complete search history.

(56) References Cited

U.S. PATENT DOCUMENTS

| | | | |
|---|---|---|---|
| 7,261,240 B2 | 8/2007 | Akiho et al. | |
| 7,471,260 B2 * | 12/2008 | Ochi et al. | 343/895 |
| 7,552,876 B2 | 6/2009 | Nishizawa et al. | |
| 7,775,446 B2 * | 8/2010 | Ochi et al. | 235/492 |
| 7,924,235 B2 | 4/2011 | Fujimoto et al. | |
| 2004/0140896 A1 | 7/2004 | Ohkawa et al. | |
| 2005/0134463 A1 * | 6/2005 | Yamazaki | 340/572.8 |
| 2006/0151614 A1 | 7/2006 | Nishizawa et al. | |
| 2007/0176298 A1 * | 8/2007 | Osone et al. | 257/777 |
| 2007/0296037 A1 * | 12/2007 | Dozen et al. | 257/350 |
| 2009/0051606 A1 * | 2/2009 | Ochi et al. | 343/702 |
| 2010/0052996 A1 * | 3/2010 | Ochi et al. | 343/702 |

FOREIGN PATENT DOCUMENTS

| | | |
|---|---|---|
| JP | 6-344692 | 12/1994 |
| JP | 8-16745 | 1/1996 |
| JP | 2000-163544 | 6/2000 |

(Continued)

*Primary Examiner* — Tan Ho
(74) *Attorney, Agent, or Firm* — McDermott Will & Emery LLP

(57) ABSTRACT

The semiconductor memory module incorporating antenna includes a wiring board (11) having a connection terminal (17) connected with a control semiconductor element (16) and arranged at a position exposed to the surface of an outer case (15), and a terminal electrode (18) for antenna connection connected with the control semiconductor element (16) and arranged in the outer case (15); a semiconductor storage element (12) mounted on one side of the wiring board (11); and a loop-like antenna (13) and an antenna terminal electrode (20) formed on the other side of the wiring board (11) along the outer peripheral thereof, the wiring board (11) includes at least one magnetic body layer (14) and the terminal electrode (18) for antenna connection is connected with the antenna terminal electrode (20).

17 Claims, 9 Drawing Sheets

FOREIGN PATENT DOCUMENTS

| | | |
|---|---|---|
| JP | 2001-195553 | 7/2001 |
| JP | 2001-209773 | 8/2001 |
| JP | 2004-94522 | 3/2004 |
| JP | 2004-227046 | 8/2004 |
| JP | 2005-217946 | 8/2005 |
| JP | 2006-041985 | 2/2006 |
| WO | WO 2005/004047 A1 | 1/2005 |
| WO | WO 2006/038446 A1 | 4/2006 |

* cited by examiner

SEMICONDUCTOR MEMORY MODULE INCORPORATING ANTENNA

RELATED APPLICATIONS

This application is the U.S. National Phase under 35 U.S.C. §371 of International Application No. PCT/JP2007/056662, filed on Mar. 28, 2007, which in turn claims the benefit of Japanese Application No. 2006-101740, filed on Apr. 3, 2006, the disclosures of which Applications are incorporated by reference herein.

TECHNICAL FIELD

The present invention relates to a semiconductor memory module incorporating antenna combining a memory card, such as SD (Secure Digital) memory card, and an antenna function.

BACKGROUND ART

Recently, various memory cards of large capacity have been become widespread, and used in digital camera, portable music player, portable information terminal, and other portable digital appliances. Recently, it has been desired to add a radio communication function in order to expand the scope of application of memory cards.

An SD memory card with radio interface function has been proposed (see, for example, patent document 1). This SD memory card has a function part and a radio control part as storage medium, and an antenna module having an antenna is connected to the radio control part by way of a connection part. The incorporated flash memory is a flash ROM for memory of SD memory card, and stores a driver program for operating the radio communication function. In this configuration, the SD memory card connected to the antenna module is assembled in an electronic appliance such as a potable digital appliances, and communications with external radio communication appliance can be controlled.

To improve the characteristics of coil antenna for data transmission and reception, a thin module of IC card type is proposed, in which a magnetic body is carried at least on a wiring board forming an antenna, or a board forming an insulating outer layer of IC card (see, for example, patent document 2).

The thin module of IC card type of patent document 2 is described below while referring to FIG. 10. FIG. 10 is a perspective exploded view of a conventional thin module of IC card type. As shown in FIG. 10, on wiring board 1 (85 mm in length, 52 mm in width), a specified wiring pattern is formed on the principal plane of an insulating board of glass epoxy resin or similar material, and coil pattern 2 for antenna is formed in an outer peripheral region. At specified positions on the principal plane of wiring board 1, microcomputer chip 3 for storing and controlling information, chip component 4 for generating reference oscillation signal, and battery 5 for power source are mounted, and are electrically connected to wiring pattern or coil pattern 2 for antenna. Wiring board 1 is formed integrally by means of an adhesive by laminating resin-made frame 6 of same shape as wiring board 1, and insulating outer layer 7 preliminarily forming magnetic body layers on both sides of the board. Similarly, another insulating outer layer 7 is formed integrally with wiring board 1 by means of an adhesive.

The thin module of IC card type of patent document 2 is enhanced in the antenna function of coil pattern 2 for detecting a signal of electromagnetic wave from outside by forming a magnetic body layer. For example, if the number of turns of coil pattern 2 of the thin module is small, the inductance can be increased by the magnetic body layer, so that the signal of electromagnetic wave can be amplified.

In the SD memory card of patent document 1, however, since the antenna module is externally attached to the end of the SD memory card, the outer size of the SD memory card is increased by the portion of the antenna module.

The thin module of IC card type of patent document 2 is enhanced in the antenna function, but nothing particular is mentioned about reducing the IC card into a specified size such as the SD memory card.

Or when a contact-free communication antenna, a semiconductor element, and a magnetic body layer are incorporated within a specified space of SD memory card or the like, unless the configuration is optimized, the electromagnetic wave reflected from the semiconductor element may get into the antenna to cause malfunction.

Patent document 1: Unexamined Japanese Patent Publication No. 2001-195553
Patent document 2: Unexamined Japanese Patent Publication No. H6-344692

DISCLOSURE OF THE INVENTION

The semiconductor memory module incorporating antenna of the present invention includes a wiring board having a connection terminal connected to a control semiconductor element and arranged at a position exposed to the surface of an outer case, and a terminal electrode for antenna connection connected with the control semiconductor element and arranged in the outer case; a semiconductor storage element mounted on one side of the wiring board; and a loop-like antenna and an antenna terminal electrode formed on the other side of the wiring board along the outer peripheral thereof, in which the wiring board includes at least one magnetic body layer, and the terminal electrode for antenna connection is connected with the antenna terminal electrode.

In this configuration, without increasing the size of the wiring board, a loop-like antenna of a large diameter can be provided by making use of the outer peripheral region effectively. The antenna and the semiconductor storage element are disposed oppositely to each other across the wiring board by way of magnetic body layer, so that reflection of electromagnetic wave from the semiconductor storage element is prevented, and the quality of signal entering the antenna is maintained, and malfunction can be avoided.

Moreover, depending on the importance of the information such as transmission of large capacity or confidentiality of information, a semiconductor memory module incorporating antenna capable of select contact or non-contact may be realized.

The semiconductor memory module incorporating antenna of the present invention includes a mounting module composed of a wiring board having a connection terminal connected to a control semiconductor element and arranged at a position exposed to the surface of an outer case, and a terminal electrode for antenna connection connected with the control semiconductor element and arranged in the outer case, and a semiconductor storage element and the control semiconductor element mounted on the wiring board; and an antenna module composed of a loop-like antenna formed along near the outer peripheral of one side of a sheet-like board made of resin, and an antenna terminal electrode formed on one side or the other side, in which the mounting module mounting the semiconductor storage element on one side of the wiring board including at least one magnetic body layer is disposed so that the other side of the wiring board is overlaid with the antenna module, and the terminal electrode for antenna connection and the antenna terminal electrode are connected to each other.

In this configuration, the mounting module and the antenna module are formed individually, and the semiconductor memory module incorporating antenna can be manufactured at high productivity.

Figure 1:
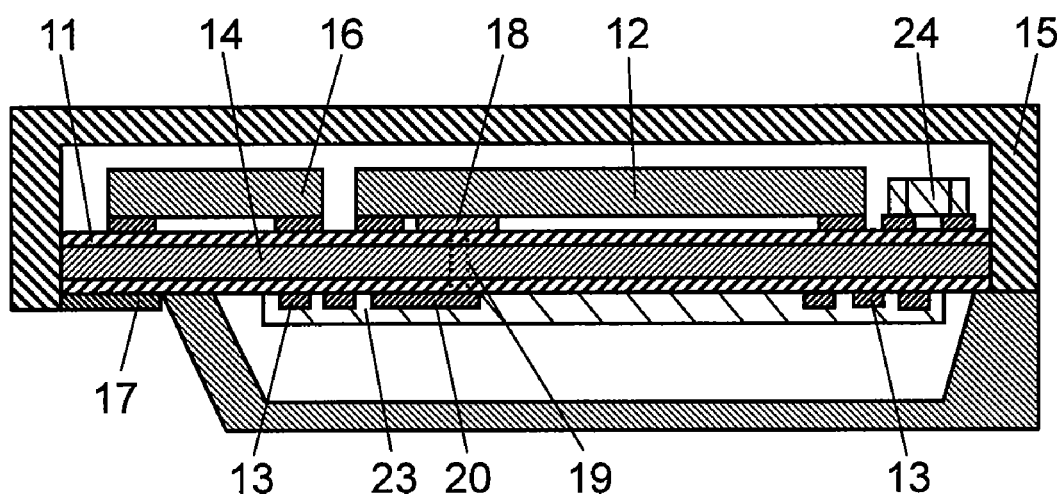
FIG. 1 is a sectional view of a semiconductor memory module incorporating antenna in a first preferred embodiment of the present invention.

DESCRIPTION OF THE REFERENCE NUMERALS AND SIGNS 1, 11, 32, 89 Wiring board
2 Coil pattern
3 Microcomputer chip
4 Chip component
5 Battery
6 Resin-made frame
7 Insulating outer layer
10, 28, 30, 31, 50, 75, 80, 90 SD memory card (semiconductor memory module incorporating antenna)
12, 76, 82 Semiconductor storage element
13, 37 Antenna
14, 27, 29, 35 Magnetic body layer
15 Outer case
16 Control semiconductor element
17 Connection terminal
18, 22 Terminal electrode for antenna connection
19 Via conductor
20, 21, 39 Antenna terminal electrode
23, 38, 58, 65 Insulating protective layer
24 Chip capacitor
25, 26 Mounting module
33, 34, 51 Antenna module
36 Sheet-like board
40, 67, 69, 70 Lead-through electrode
41 Insulating adhesive
42, 59, 68 Protrusion
43, 56 Antenna connection terminal
44 Opening
45, 66 Conductive adhesive
52 First antenna module
53 Second antenna module
54 First antenna
55 Second antenna
57 First sheet-like board
60 Common terminal (common antenna terminal electrode)
61 Second antenna terminal electrode
62 First connection electrode
63 Second sheet-like board
64 Adhesive layer
71 Adhesive sheet layer
77 Storage unit
78 Circuit board
79, 84 Conductive connector
81 Sub-board
83 Auxiliary wiring board
91 Magnetic body board
92 electrode of mounting component

DETAILED DESCRIPTION OF THE PREFERRED EMBODIMENTS

Preferred embodiments of the present invention are described below while referring to the accompanying drawings. In the drawings, for the ease of understanding of the configuration, the dimension in the thickness direction is shown in a magnified size. Same elements are identified with same reference numerals and repeated explanations may be omitted. In the following preferred embodiments, the SD memory card is shown as an example of semiconductor memory module incorporating antenna. Therefore, in the following explanation, the semiconductor memory module incorporating antenna may be also called the SD memory card.

First Preferred Embodiment

Figure 2A:
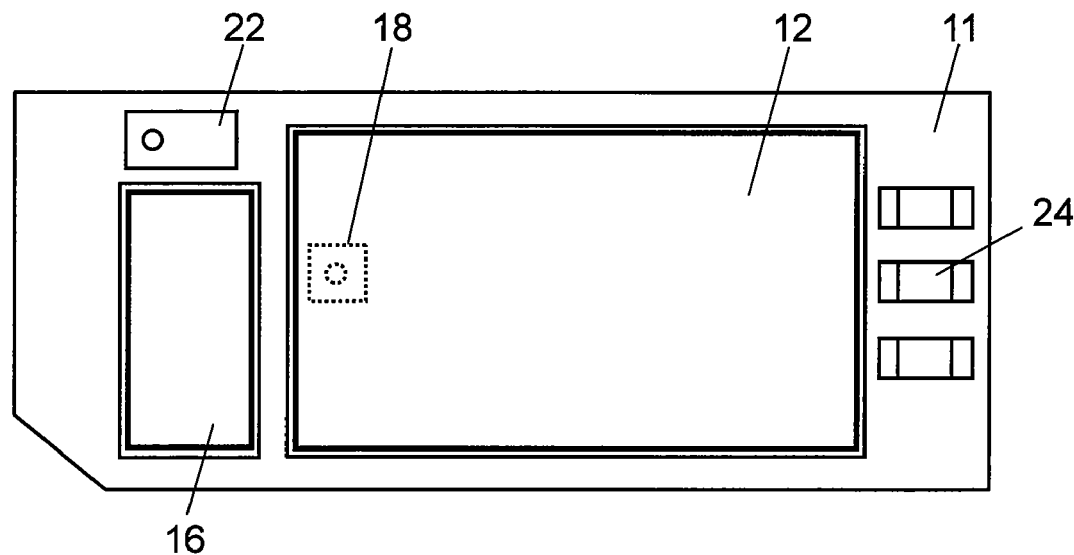
FIG. 2A is a schematic plan view of the semiconductor memory module incorporating antenna in the first preferred embodiment of the present invention, as seen from one side of the wiring board.
Figure 2B:
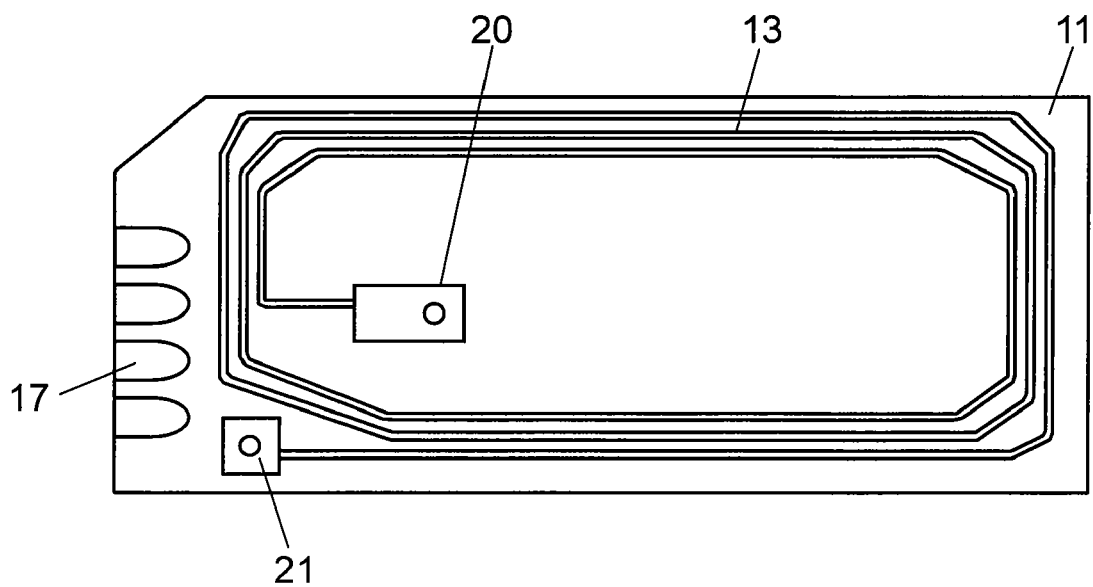
FIG. 2B is a schematic plan view of the semiconductor memory module incorporating antenna in the first preferred embodiment of the present invention, as seen from the antenna forming side.

FIG. 1 is a sectional view of SD memory card 10 in a first preferred embodiment of the present invention. FIG. 2A is a schematic plan as seen from one side of wiring board 11, and FIG. 2B is a schematic plan view as seen from the other side of wiring board 11. That is, FIG. 2A is a schematic diagram of components on wiring board 11 as seen from mounting side of semiconductor storage element 12, and FIG. 2B is a schematic diagram of components on wiring board 11 as seen from forming side of antenna 13.

As shown in FIG. 1, SD memory card 10 of the present preferred embodiment has wiring board 11 of multiple layers including at least one magnetic body layer 14 in the inside incorporated in outer case 15. Wiring board 11 has semiconductor storage element 12, control semiconductor element 16, and chip capacitor 24 mounted on one side, and has antenna 13 with antenna terminal electrode 20 formed on the other side. On the other side of wiring board 11, connection terminal 17 is formed at a position exposed from outer case 15. At this time, control semiconductor element 16 is connected to connection terminal 17 and terminal electrode for antenna connection 18 formed on wiring board 11 by way of a wiring (not shown). Terminal electrode for antenna connection 18 is connected to antenna terminal electrode 20 of loop-like antenna 13 by way of via conductor 19 penetrating through wiring board 11. Connection terminal 17 of wiring board 11 is used for connecting electrically with a terminal (not shown) of an external device when SD memory card 10 is inserted, for example, in the external device (not shown).

Inside wiring board 11, at least one magnetic body layer 14 is provided, and semiconductor storage element 12 and antenna 13 mounted on both sides are disposed oppositely to each other across magnetic body layer 14. At this time, as shown in FIG. 1, control semiconductor element 16 and chip capacitor 24 are similarly disposed oppositely to antenna 13 across magnetic body layer 14. Therefore, when SD memory card 10 is used to send and receive signals by electromagnetic wave with an external device without making contact, since signal is not reflected by the conductor such as electrode portion of semiconductor storage element 12, the reception sensitivity of antenna 13 is not lowered. As a result, the signal of electromagnetic wave entering from the antenna side is prevented from entering the semiconductor storage element by magnetic body layer 14, and it is free from reflection of electromagnetic wave (having demagnetizing field) generated by eddy current by semiconductor storage element or the like. Hence, SD memory card 10 capable of receiving signal of electromagnetic wave from an external device by antenna 13 at high sensitivity is realized.

A glass epoxy resin board of about 100 μm in thickness having at least one magnetic body layer 14 may be used as wiring board 11. Magnetic body layer 14 is formed in a thickness of 10 to 50 μm by printing of magnetic body paste mixing, for example, magnetic body powder such as ferrite powder and resin material such as epoxy resin, and is laminated with the resin board. At this time, magnetic body powder such as ferrite powder may be adhered to a ceramic sheet, and used as magnetic body layer.

On one side of wiring board 11, as shown in FIG. 2A, semiconductor storage element 12 of 50 to 100 μm in thickness, for example, control semiconductor element 16, and chip capacitor 24 for preventing noise are mounted. As shown in FIG. 2B, further, at one end of the other side of wiring board 11, a specified number of connection terminals 17 exposed from outer case 15, and antenna 13 are disposed. Further as shown in FIG. 2A and FIG. 2B, terminal electrodes for antenna connection 18, 22 provided on one side of wiring board 11, and antenna terminal electrodes 20, 21 of loop-like antenna 13 formed along near the outer peripheral on the other side of wiring board 11 are connected with each other by way of via conductors 19. Herein, loop-like antenna 13 is formed on wiring board 11 in a thickness of about 10 μm by using silver paste or the like by printing method. At this time, on the surface of antenna 13, insulating protective layer 23 of about 10 μm in thickness is formed by printing. As a result, the conductor pattern of antenna 13 is protected mechanically, but it is not particularly required if antenna 13 can be mounted safely.

Semiconductor storage element 12 and control semiconductor element 16 are connected by means of wiring electrode (not shown). The wiring electrode connected to semiconductor storage element 12 on one side of wiring board 11, and the wiring electrode connected to connection terminal 17 on the other side are connected with each other by way of via conductors (not shown). These connection terminals 17, wiring electrodes, and via electrodes are processed and formed in specified patterns by using copper or metal foils or conductive resins. Semiconductor storage element 12 and control semiconductor element 16 are mounted on wiring board 11 by any known method, such as solder bump bonding, Au (gold) bump bonding, or conductor adhesive method.

Control semiconductor element 16 controls the information from external device (not shown) sent and received through semiconductor storage element 12, connection terminals 17 or antenna 13, in contact or without contact.

In the first preferred embodiment of the present invention, the mounting method and assembling method of SD memory card 10 are explained by referring to FIG. 1.

First, as shown in FIG. 1, a wiring electrode is formed on one side of wiring board 11, and a wiring electrode for loop-like antenna 13 of large diameter and connection terminal 17 is formed on the other side, near the outer peripheral.

Next, via conductors are formed, and wiring electrodes on one side and other side of wiring board 11 are connected with each other.

On one side of wiring board 11, semiconductor storage element 12, control semiconductor element 16 and chip capacitor 24 or the like are mounted, and installed in outer case 15. At this time, connection terminals 17 are disposed as being exposed from a specified position of outer case 15. In this method, SD memory card 10 is manufactured.

According to SD memory card 10 of the present preferred embodiment, SD memory card 10 to be contained in a specified size of 24 mm×32 mm×2.1 mm is realized. Further, through antenna or connection terminal, contact system and non-contact system can be selected, and information can be exchanged with an external device, and SD memory card 10 of much higher function than in the prior art can be realized. Further, by magnetic body layer 14 provided on wiring board 11, semiconductor storage element 12 and antenna 13 are disposed oppositely to each other across wiring board 11. As a result, the signal of electromagnetic wave entering from the antenna side is prevented from being reflected by the electrode portion such as semiconductor storage element 12, and the SD memory card capable of sending and receiving signals of electromagnetic wave from external device at high sensitivity can be realized by means of antenna 13.

As semiconductor storage element 12 or control semiconductor element 16, package type or bare chip type may be used. Or a sub-board may be composed by mounting a semiconductor storage element of bare chip type described below.

A first example of SD memory card in the first preferred embodiment of the present invention is described below while referring to FIG. 3.

Figure 3:
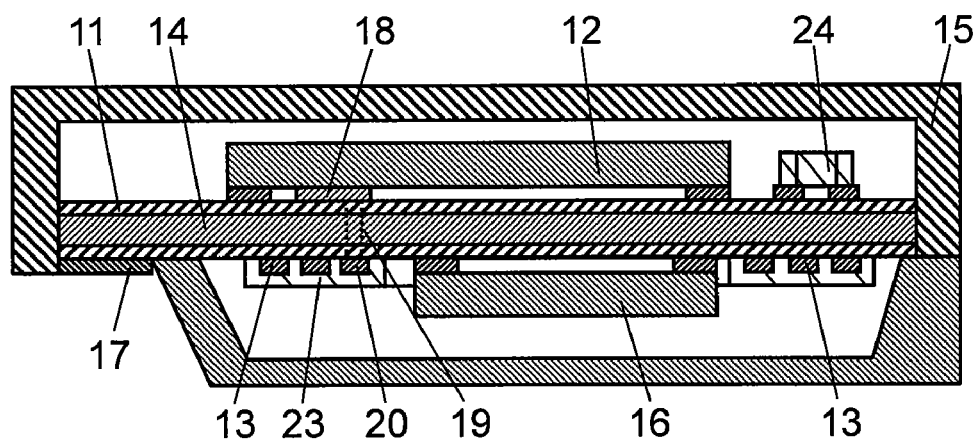
FIG. 3 is a sectional view of a first example of the semiconductor memory module incorporating antenna in the first preferred embodiment of the present invention.

FIG. 3 is a sectional view of a first example of SD memory card in the first preferred embodiment of the present invention. As shown in FIG. 3, SD memory card 28 is different from SD memory card 10 in FIG. 1 in that semiconductor storage element 12 of larger storage capacity, that is, wider chip area is used. Hence, semiconductor storage element 12 is mounted on one side of wiring board 11, and control semiconductor element 16 is mounted in a loop of loop-like antenna 13 formed on the other side.

According to this preferred embodiment, by the increase of storage capacity, SD memory card 28 mounting semiconductor storage element 12 of larger chip size is realized. That is, a greater effect is obtained when it is difficult to mount all of semiconductor storage element 12 of large size as shown in FIG. 1, and control semiconductor element 16, and chip capacitor 24 on one side of wiring board 11.

Figure 4:
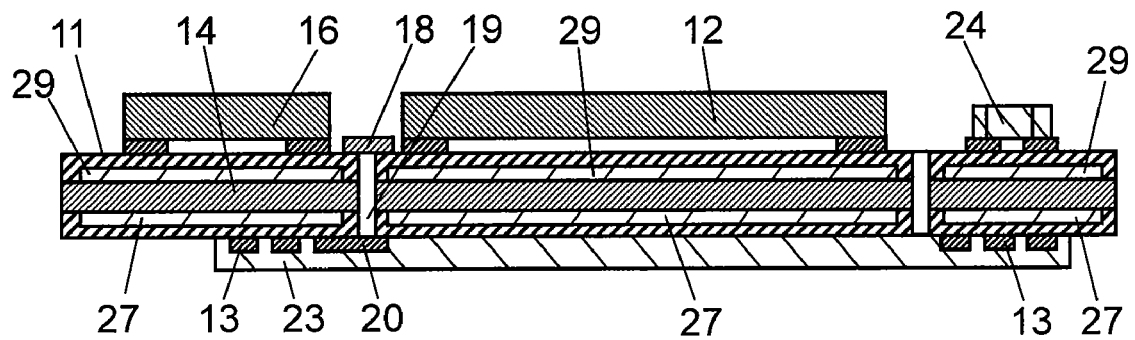
FIG. 4 is a sectional view of a second example of the semiconductor memory module incorporating antenna in the first preferred embodiment of the present invention.

A second example of SD memory card in the first preferred embodiment of the present invention is described below while referring to FIG. 4. In FIG. 4, the outer case is not shown.

FIG. 4 is a sectional view of a second example of SD memory card in the first preferred embodiment of the present invention. As shown in FIG. 4, it is different from SD memory card in FIG. 1 in that magnetic body layers 27, 29 are further provided on magnetic body layer 14 of wiring board 11. That is, as seen from the side of wiring board 11 forming antenna 13, patterned magnetic body layers 27, 29 are inserted in wiring board 11, in a wider area than the disposing region of semiconductor storage element 12, control semiconductor element 16, and chip capacitor 24. At this time, magnetic body layers 27, 29 is preferred to be formed, for example, independently, so as not to connect electrically with via conductors 19 penetrating through wiring board 11. It is not required, however, if the magnetic body layers are not conductive.

Herein, magnetic body layers 27, 29 may be made of any one material selected from Fe, Ni, and Co, or two or more materials such as FeNi or FeCo.

According to this preferred embodiment, incidence of signals of electromagnetic wave from antenna side into the conductor of semiconductor storage element can be prevented by double triple structure of magnetic body layer 14 and magnetic body layers 27, 29. As a result, the decline of reception sensitivity of the antenna is suppressed, and signals of electromagnetic wave can be received through antenna 13 at higher precision.

Preferably, magnetic body layers 27, 29 are inserted in both sides of magnetic body layer 14, but either one of magnetic body layers 27, 29 may be inserted, and the S/N ratio of signal received in the antenna can be enhanced.

Second Preferred Embodiment

Figure 5A:
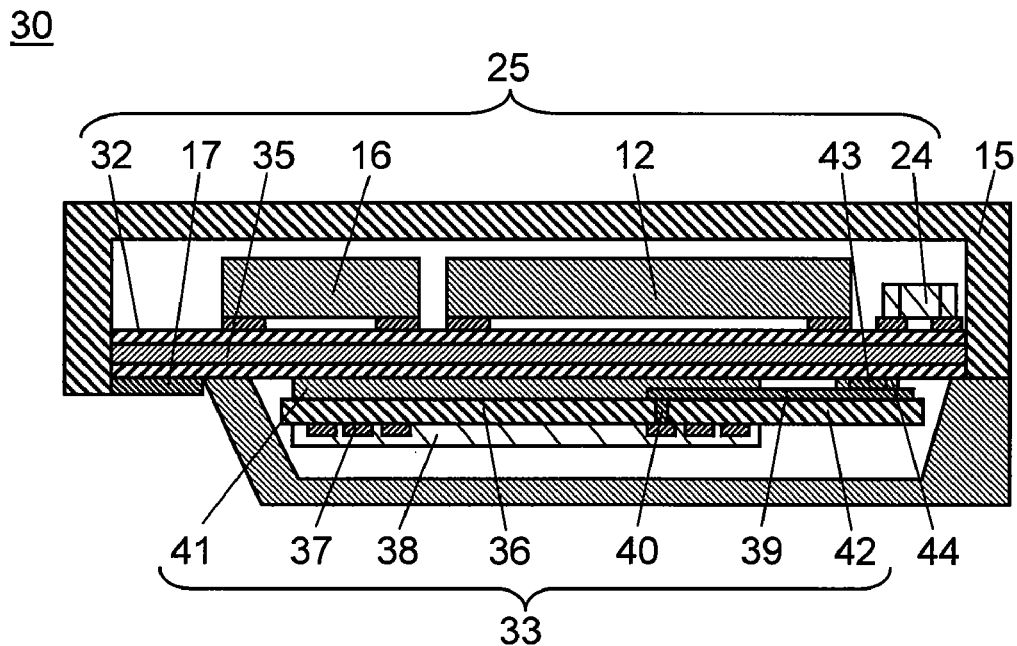
FIG. 5A is a sectional view of a semiconductor memory module incorporating antenna in a second preferred embodiment of the present invention.

FIG. 5A is a sectional view of SD memory card 30 in a second preferred embodiment of the present invention. Specifically, FIG. 5A shows a sectional view of SD memory card 30 having semiconductor storage element 12 and control semiconductor element 16 mounted on one side of wiring board 32. It is different from the SD memory card in the first preferred embodiment in that antenna is not formed directly on one side of wiring board 32. That is, antenna module 33 is tightly laminated on a side of wiring board 32 different from the mounting side of semiconductor storage element 12.

As shown in FIG. 5A, SD memory card 30 has mounting module 25 mounting semiconductor storage element 12 and control semiconductor element 16 laminated on one side of wiring board 32 composed of multiple layers having at least one magnetic body layer 35 in the inside, and antenna module 33 laminated on the other side of wiring board 32, and is assembled in outer case 15.

Antenna module 33 is composed of loop-like antenna 37 formed on one side of sheet-like board 36, insulating protective layer 38 for protecting antenna 37, and antenna terminal electrode 39 connected to antenna 37 formed on the other side by means of lead-through electrode 40. Antenna module 33 is laminated on wiring board 32 of mounting module 25 by means of, for example, insulating adhesive 41.

Sheet-like board 36 is a resin sheet of, for example, polyethylene terephthalate (PET) of thickness of 50 to 100 μm, and at one end, as shown in FIG. 5A, protrusion 42 is provided for disposing antenna terminal electrode 39. On one side of sheet-like board 36, loop-like antenna 37 of large diameter is formed along the outer peripheral in a thickness of about 10 μm by printing of, for example, silver paste. The end portion of antenna 37 is connected to antenna terminal electrode 39 disposed in protrusion 42 by way of lead-through electrode 40. Antenna 37, antenna terminal electrode 39, and lead-through electrode 40 may be formed by using same silver paste or conductive paste or different materials.

Wiring board 32 and antenna module 33 of mounting module 25 are laminated, and antenna connection terminal 43 of wiring board 32 and antenna terminal electrode 39 of sheet-like board 36 are connected with each other by means of, for example, conductive adhesive 45. This connection may be made also by soldering. As a result, information received in antenna 37 is input control semiconductor element 16, and the information output from control semiconductor element 16 is sent to an external device through antenna 37.

In the present preferred embodiment, since the circuit wiring can be formed on the side of wiring board 32 laminating antenna module 33, the both sides of wiring board 32 can be utilized effectively, and the degree of freedom of circuit design may be enhanced. As a result, SD memory card 30 of higher function is realized.

Figure 5B:
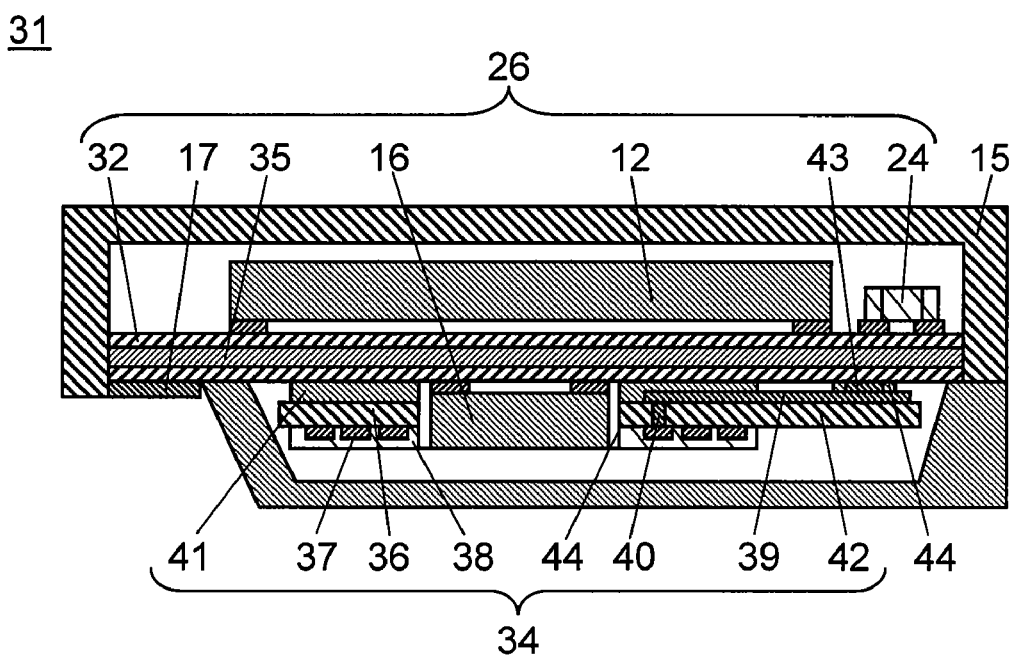
FIG. 5B is a sectional view of another example of the semiconductor memory module incorporating antenna in the second preferred embodiment of the present invention.

Another example of SD memory card of the second preferred embodiment of the present invention is described by referring to FIG. 5B.

FIG. 5B is a sectional view showing another example of SD memory card of the second preferred embodiment of the present invention. That is, as shown in FIG. 5B, SD memory card 31 has mounting module 26 mounting semiconductor storage element 12 laminated on one side of wiring board 32 having at least one magnetic body layer 35 in the inside (inner layer), and antenna module 34 laminated on the other side of wiring board 32, and is assembled in outer case 15. Opening 44 is provided inside of loop-like antenna 37 of antenna module 34, and control semiconductor element 16 is mounted on wiring board 32 of mounting module 26 by way of opening 44, which is different from FIG. 5A. The other configuration is same SD memory card 30 in FIG. 6A, and the same explanation is omitted.

As a result, a chip of large storage capacity and large size is used in semiconductor storage element 12, and can be mounted easily on one side of wiring board 32.

SD memory card 31 may be used as sub-board mounting multiple semiconductor storage elements as described below same as in the first preferred embodiment. As a result, SD memory card effectively incorporating semiconductor storage elements of large storage capacity in a specified space can be realized.

In the present preferred embodiment, same effects as in the SD memory card in the first preferred embodiment can be obtained, and since the mounting module and antenna module can be formed individually, and the productivity is excellent, and SD memory card of low cost is realized.

As wiring board 32, a wiring board having a plurality of magnetic body layers as shown in FIG. 4 in the first preferred embodiment may be also used.

Third Preferred Embodiment

Figure 6A:
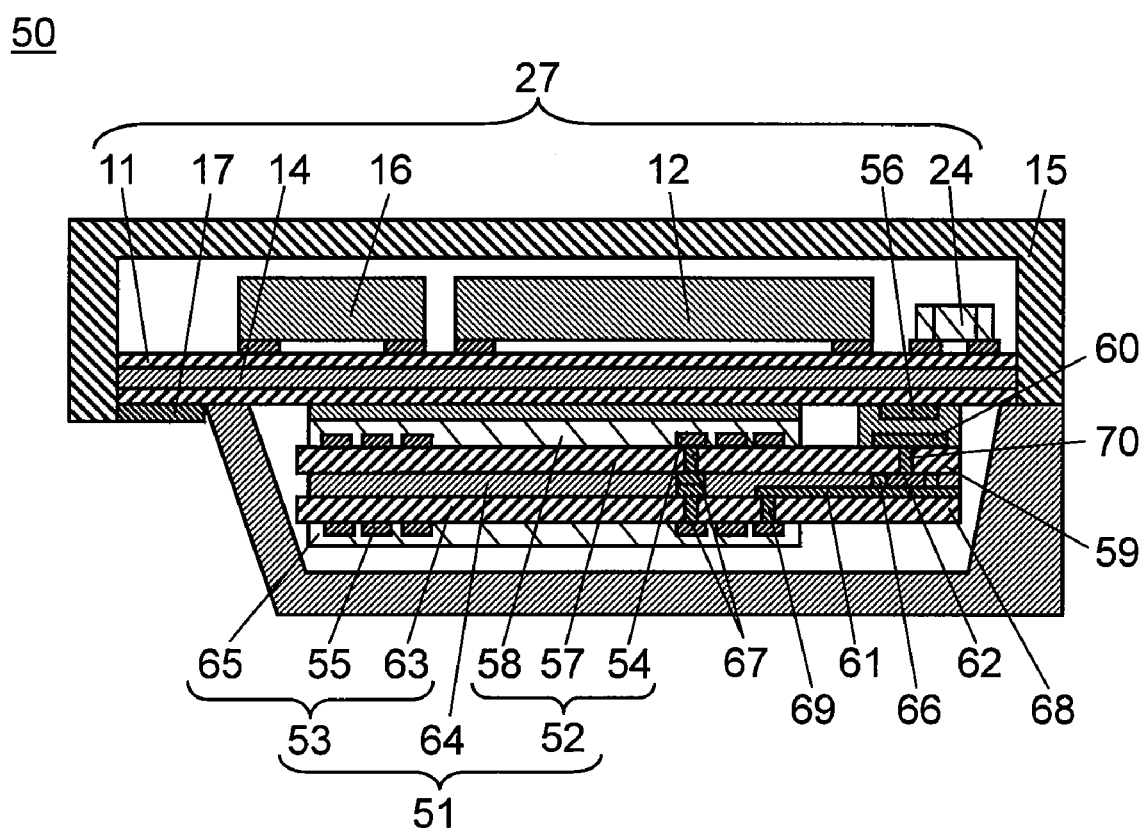
FIG. 6A is a sectional view of a semiconductor memory module incorporating antenna in a third preferred embodiment of the present invention.
Figure 6B:
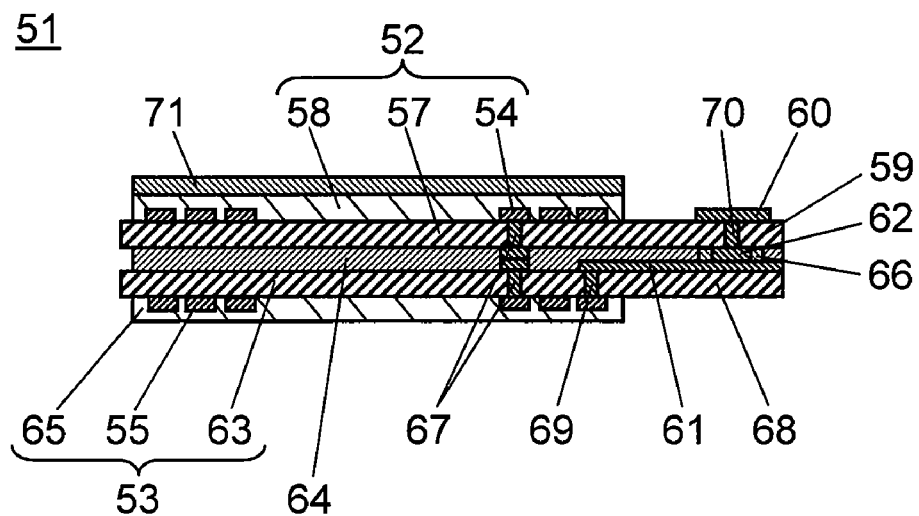
FIG. 6B is a sectional view of antenna module of the semiconductor memory module incorporating antenna in the third preferred embodiment of the present invention.

FIG. 6A is a sectional view of SD memory card 50 in a third preferred embodiment of the present invention, and FIG. 6B is a schematic sectional view of antenna module 51 of SD memory card 50.

As shown in FIG. 6A and FIG. 6B, in SD memory card 50, the configuration of antenna module 51 is different from that of SD memory card 30 in the second preferred embodiment. That is, in SD memory card 50 of the present preferred embodiment, antenna module 51 is composed by laminating first antenna module 52 and second antenna module 53. Wiring board 11 is a board formed of multiple layers having at least one magnetic body layer 14 in the inside (inner layer) same as in the first preferred embodiment.

Following is specific explanation about an example of connecting first antenna 54 of first antenna module 52 and second antenna 55 of second antenna module 53 in series, and connecting to antenna connection terminal 56 of wiring board 11.

First, as shown in FIG. 6A, first antenna module 52 has first antenna 54 formed like a loop along the outer peripheral on one side of first sheet-like board 57, and insulating protective layer 58 formed on its surface. Same as in the second preferred embodiment, antenna module 51 has protrusion 59 formed in part of first sheet-like board 57, and one side of this protrusion 59 has common antenna terminal electrode (or common terminal) 60 for connecting with antenna connection terminal 56 of wiring board 11. On the other hand, the other side of first sheet-like board 57 has first connection electrode 62 to be connected to second antenna terminal electrode 61 of second antenna module 53.

As shown in FIG. 6B, second antenna module 53 is basically same in shape as first antenna module 52, and adhesive layer 64 is formed on one side of second sheet-like board 63, and second antenna 55 of loop-like shape is formed on the other side, and insulating protective layer 65 is formed on the surface thereof.

First antenna module 52 and second antenna module 53 are disposed and adhered across adhesive layer 64 of second antenna module 53. Hence, antenna module 51 is manufactured. At this time, first connection electrode 62 of first antenna module 52 and second antenna terminal electrode 61 of second antenna module 53 are connected with each other by way of, for example, conductive adhesive 66.

One end of first antenna 54 of first antenna module 52 is connected to one of common terminals 60, and other end is connected to one end of second antenna 55 of second antenna terminal 53 by extending up to other side of first sheet-like board 57 by way of lead-through electrode 67.

Similarly, second antenna 55 is extended up to one side of second sheet-like board 63 by way of protrusion 68 of second sheet-like board 63 or lead-through electrode 69, and is connected to first connection electrode 62 disposed at the other side of first sheet-like board 57. At this time, second antenna 55 is formed in a loop-like pattern in the same winding direction as first antenna 54. First connection electrode 62 is drawn out to one side of first sheet-like board 57 by way of lead-through electrode 70, and is connected to other common terminal 60.

As a result, first antenna 54 and second antenna 55 are connected in series, and the end portions are connected to common terminal 60, and antenna module 51 is obtained.

Antenna module 51 is adhered and laminated to mounting module 25 by way of adhesive sheet layer 71 of first antenna module 52. At this time, antenna connection terminal 56 of mounting module 25 and common terminal 60 of antenna module 51 are connected with each other by way of, for example, conductive adhesive 66.

Later, connection terminal 17 of mounting module 25 is exposed from specified position of outer case 15, and mounting module 25 and antenna module 51 are incorporated in outer case 15. Hence, SD memory card 50 of the present preferred embodiment is manufactured.

SD memory card 50 of the present preferred embodiment is composed by connecting mounting module 25 together with antenna module 51 preliminarily connecting first antenna 54 of first antenna module 52 and second antenna of second antenna module 53 integrally in series. As a result, by first antenna 54 and second antenna 55 connected in series, the antenna length can be extended, and the number of turns of loop can be increased, so that the antenna sensitivity may be enhanced.

In the present preferred embodiment, same effects as in the SD memory card of the first preferred embodiment can be obtained, and same as in the second preferred embodiment, the mounting module and antenna module can be formed separately, and the SD memory card excellent in productivity and low cost is realized.

In the present preferred embodiment, first antenna 54 and second antenna 55 are connected in series, and connected to antenna connection terminal 56 of wiring board 11, but the invention is not limited to this example. For example, first antenna 54 and second antenna 55 may be connected in parallel. In this case, as common terminals 60 of antenna module 51, for example, four terminals may be formed, two from first antenna 54 and two from second antenna 55, and may be connected with antenna connection terminal 56 of wiring board 11 formed correspondingly. In protrusion 59 of first sheet-like board 57 and protrusion 68 of second sheet-like board 63, preliminarily first antenna 54 and second antenna 55 are connected in parallel by way of lead-through electrode, and may be connected with antenna connection terminal 56 of wiring board 11 only at two positions. Hence, if conductive resin paste of relatively high resistance is used, the antenna resistance may be lowered, and the antenna sensitivity may be enhanced.

Within a scope to be assembled in a specified space of 24 mm×32 mm×2.1 mm for SD card memory, the configuration of antenna of antenna module is not limited to the configuration shown in the present preferred embodiment, and may be designed freely.

Same as in the second preferred embodiment, an opening may be provided inside of the loop-like antenna of antenna module, and a control semiconductor element may be disposed. As a result, a semiconductor storage element of larger storage capacity may be disposed, and SD memory card of higher capacity may be realized.

In the first preferred embodiment to the third preferred embodiment, magnetic body powder such as ferrite powder may be mixed in the insulating protective layer of antenna or sheet-like board or adhesive layer. As a result, a magnetic flux is converged in the loop of loop-like antenna, and the antenna sensitivity may be further enhanced.

Fourth Preferred Embodiment

Figure 7A:
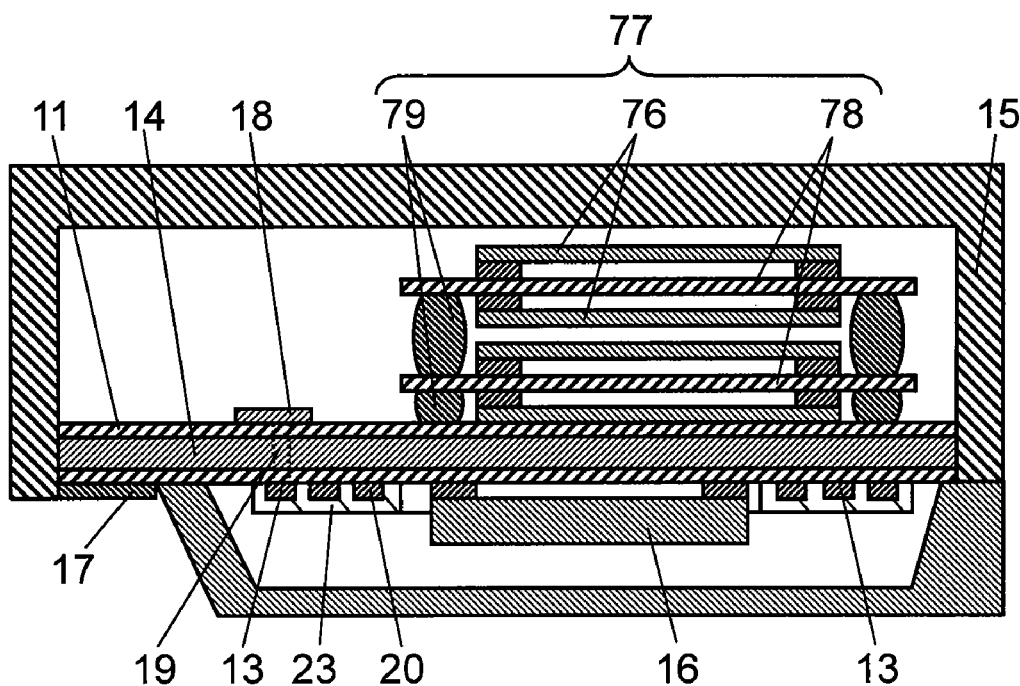
FIG. 7A is a sectional view of a semiconductor memory module incorporating antenna in a fourth preferred embodiment of the present invention.
Figure 7B:
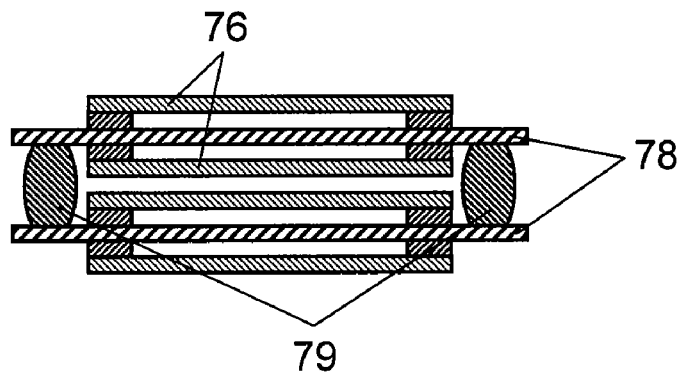
FIG. 7B is a sectional view of storage unit of the semiconductor memory module incorporating antenna in the fourth preferred embodiment of the present invention.

FIG. 7A is a sectional view of SD memory card 75 in a fourth preferred embodiment of the present invention, and FIG. 7B is a sectional view of storage unit 77 of SD memory card 75. As shown in FIG. 7B, SD memory card 75 is different from SD memory cards in the other preferred embodiments in that storage unit 77 of large capacity laminating semiconductor storage elements 76 is provided. As shown in FIG. 7B, storage unit 77 is composed of circuit boards 78 laminating semiconductor storage elements 76, and conductive connector 79 connected between circuit boards 78. Other configuration is same as in the first preferred embodiment.

As shown in FIG. 7A, SD memory card 75 includes storage unit 77 mounted on one side of wiring board 11, and antenna 13 and control semiconductor element 16 mounted on the other side, and is assembled in outer case 15. At this time, control semiconductor element 16 is connected to connection terminal 17 and terminal electrode for antenna connection 18 of wiring board 11. Further, terminal electrode for antenna connection 18 is connected to antenna terminal electrode 20 connected to loop-like antenna 13 by way of via conductor 19 penetrating through wiring board 11.

In SD memory card 75 of the present preferred embodiment, the storage capacity can be increased by storage unit, and information can be transmitted to and from an external device either in contact or in non-contact, and the SD memory card applicable in a wider scope can be realized.

Another example of SD memory card of the fourth preferred embodiment of the present invention is described below.

Figure 8A:
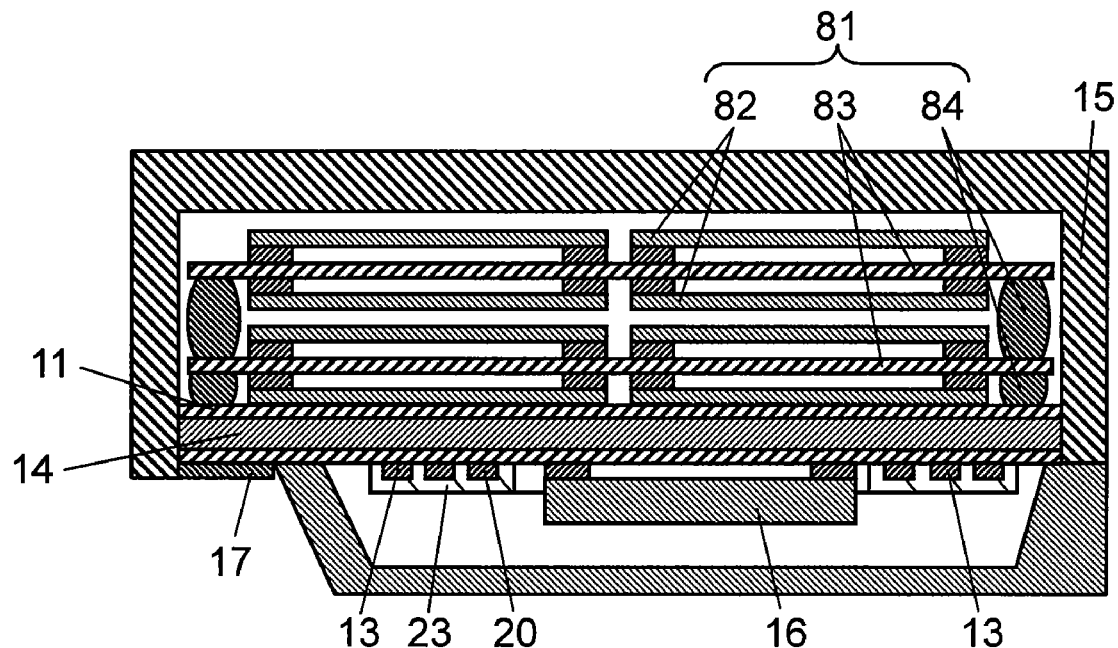
FIG. 8A is a sectional view of another example of the semiconductor memory module incorporating antenna in the fourth preferred embodiment of the present invention.
Figure 8B:
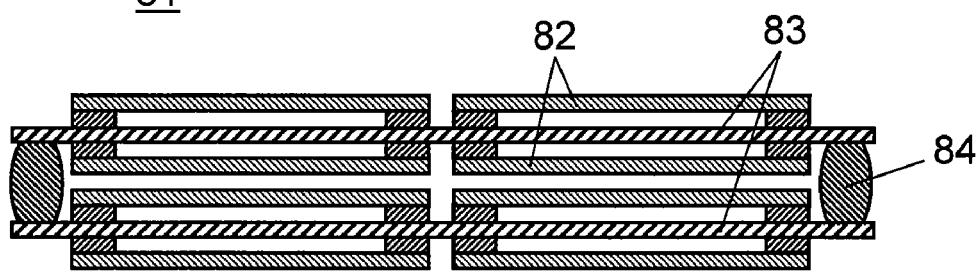
FIG. 8B is a sectional view of sub-board as storage unit of the semiconductor memory module incorporating antenna in the fourth preferred embodiment of the present invention.

FIG. 8A is a sectional view showing another example of SD memory card of the fourth preferred embodiment of the present invention, and FIG. 8B is a sectional view of sub-board as storage unit of SD memory card in the present preferred embodiment. That is, as shown in FIG. 8A, SD memory card 80 of the present preferred embodiment different from FIG. 7B in that semiconductor storage element 82 is formed as storage unit by laminating sub-board 81 mounted on both sides of auxiliary wiring board 83 at one side of wiring board 11. Other configuration is the same, and same component elements are identified with same reference numerals.

As shown in FIG. 8A, SD memory card 80 has sub-board 81 mounted on one side of wiring board 11, and antenna 13 and control semiconductor element 16 mounted on the other side, and is assembled in outer case 15. Sub-board 81 has semiconductor storage elements 82 mounted on both sides of auxiliary wiring board 83. Electrode terminals (not shown) of semiconductor storage elements 82 and electrode terminals (not shown) of auxiliary wiring board 83 are connected with each other by any known method, such as solder bonding, conductive adhesive bonding, or anisotropic conductive resin bonding.

In the present preferred embodiment, the overall thickness of sub-board 81 must be reduced. Hence, auxiliary wiring board 83 is formed thinly, and, for example, semiconductor storage element 82 of bare chip structure is used. Semiconductor storage element 82 is further desired to be formed in a thickness of, for example, 30 µm by polishing process as required.

For connection between sub-boards 81, or connection between sub-board 81 and wiring board 11, for example, conductive connector 84 such as gold ball, solder ball, conductive resin ball or the like may be used.

According to SD memory card 80 of the present preferred embodiment, the storage capacity can be increased by sub-board, and information can be transmitted with external device by making contact or without making contact, and SD memory card of wider scope of application can be realized.

Fifth Preferred Embodiment

Figure 9A:
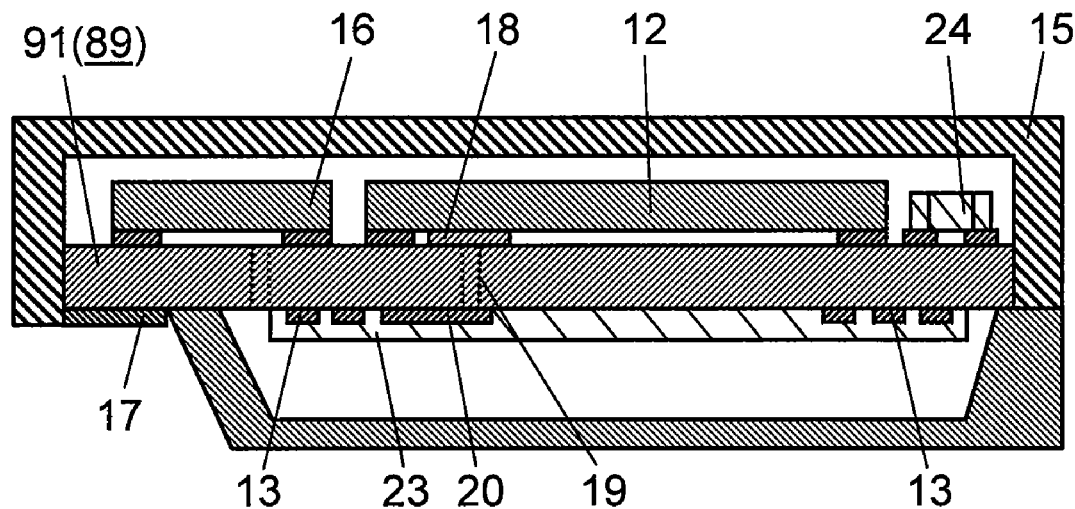
FIG. 9A is a sectional view of a semiconductor memory module incorporating antenna in a fifth preferred embodiment of the present invention.

SD memory card 90 in a fifth preferred embodiment of the present invention is described below while referring to FIG. 9A and FIG. 9B. FIG. 9A is a sectional view of SD memory card 90 in the fifth preferred embodiment of the present invention, and FIG. 9B is a sectional view of wiring board 89 used in the preferred embodiment.

Figure 9B:
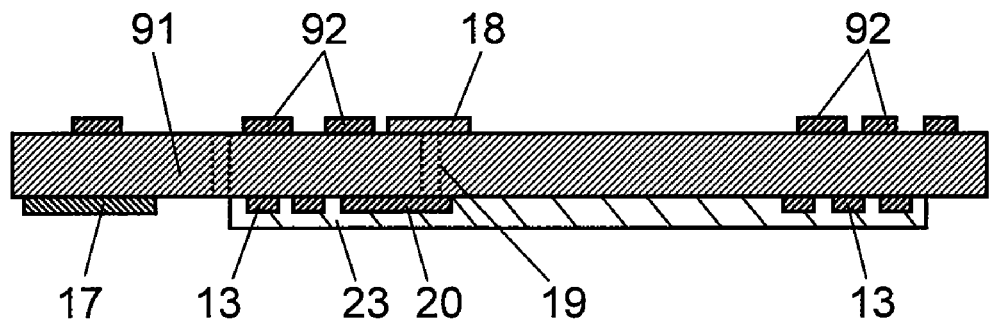
FIG. 9B is a sectional view of wiring board of the semiconductor memory module incorporating antenna in the fifth preferred embodiment of the present invention.
Figure 10:
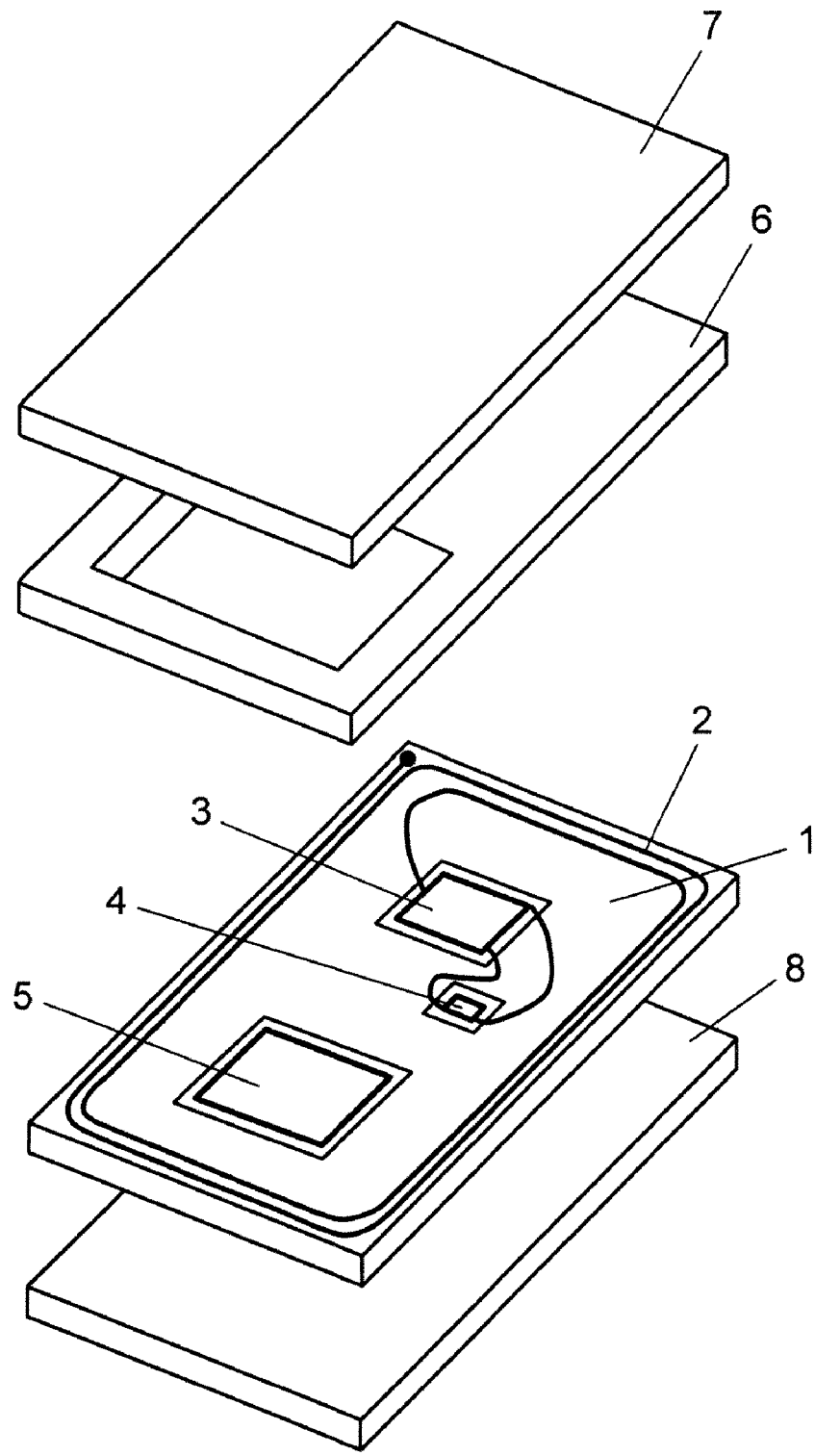
FIG. 10 is a perspective exploded view of a conventional IC card type thin module.

As shown in FIG. 9B, the SD memory card of the preferred embodiment of the present invention is different from the first preferred embodiment in that magnetic body board 91 is used as core board for composing wiring board 89. Other configuration is same as in the first preferred embodiment, and same component elements are identified with same reference numerals.

Herein, magnetic body board 91 is composed of ceramics or mixed resin material baking magnetic body material containing, for example, $CoO$ or $Fe_2O_3$. At this time, since magnetic body board 91 is magnetic, like the magnetic body layer, part of electromagnetic wave is absorbed, and shielded.

On one side of wiring board 89 using magnetic body board 91 as core board, electrode of mounting components 92 such as semiconductor storage elements and terminal electrode for antenna connection 18 are formed, and on the other side, antenna 13, antenna terminal electrode 20 and connection terminal 17 are formed.

As shown in FIG. 9A, SD memory card 90 has semiconductor storage element 12, control semiconductor element 16 and chip capacitor 24 mounted on one side of wiring board 11, and antenna 13 formed on the other side, and is assembled in outer case 15. At this time, control semiconductor element 16 is connected to connection terminal 17 of wiring board 89 and terminal electrode for antenna connection 18 by way of wiring (not shown) formed in wiring board 89. Terminal electrode for antenna connection 18 is connected to antenna terminal electrode 20 connected with loop-like antenna 13 by way of via conductor 19 penetrating through wiring board 89.

According to SD memory card 90 of the present preferred embodiment, by using magnetic body board in the core board, the wiring board is reduced in thickness, and the semiconductor storage element can be incorporated efficiently in a specified space. As a result, in a simple configuration, SD memory card enhanced in storage capacity is realized. Besides, the electromagnetic wave can be absorbed and shielded by the magnetic body board, reflection of electromagnetic wave from conductor portion of semiconductor storage element can be prevented, and signals such as information can be transmitted and received at high precision without lowering the sensitivity of the antenna.

The wiring board of the present preferred embodiment may be also applied in the second preferred embodiment to the fourth preferred embodiment, and same effects are obtained.

In the foregoing preferred embodiments, the SD memory card is explained as an example of semiconductor memory module incorporating antenna, but it can be similarly applied in memory modules of other configurations.

In the foregoing preferred embodiments, the insulating protective layer is formed for protecting the antenna, but it is not limited. For example, an insulating magnetic body layer may be formed to be used as protective layer. At this time, a magnetic body layer may be formed on the surface of the insulating protective layer, or it may be formed directly on the sheet-like board. As a result, the magnetic flux is converged in the loop of the loop-like antenna, and the antenna sensitivity may be enhanced.

INDUSTRIAL APPLICABILITY

The semiconductor memory module incorporating antenna of the present invention is easily reduced in size and thickness, and has the information transmission function of contact type and non-contact type. Hence, not limited to the SD memory card having a specified shape, it is useful as memory module used in the fields of digital camera, portable music player, and portable digital appliances such as portable information terminal or the like.

The invention claimed is:

1. A semiconductor memory module incorporating antenna comprising:
   a wiring board having a connection terminal connected to a control semiconductor element and arranged at a position exposed to the surface of an outer case, and a terminal electrode for antenna connection connected with the control semiconductor element and arranged in the outer case;
   a semiconductor storage element mounted on one side of the wiring board; and
   a loop-like antenna and an antenna terminal electrode formed on the other side of the wiring board along the outer peripheral thereof,
   wherein the wiring board includes at least one magnetic body layer, and the terminal electrode for antenna connection is connected with the antenna terminal electrode.

2. The semiconductor memory module incorporating antenna of claim 1, wherein the semiconductor storage element and the control semiconductor element are mounted on one side of the wiring board.

3. The semiconductor memory module incorporating antenna of claim 1, wherein the semiconductor storage element is mounted on one side of the wiring board, and the control semiconductor element is mounted on the other side.

4. The semiconductor memory module incorporating antenna of claim 3, wherein the control semiconductor element is mounted on the other side of the wiring board surrounded by the loop-like antenna.

5. The semiconductor memory module incorporating antenna of claim 1, wherein the semiconductor storage element is laminated on one side of the wiring board.

6. The semiconductor memory module incorporating antenna of claim 5, wherein a sub-board mounting the semiconductor storage element is laminated on one side of the wiring board.

7. A semiconductor memory module incorporating antenna comprising:
   a mounting module composed of a wiring board having a connection terminal connected to a control semiconductor element and arranged at a position exposed to the surface of an outer case, and a terminal electrode for antenna connection connected with the control semiconductor element and arranged in the outer case, and a semiconductor storage element and the control semiconductor element mounted on the wiring board; and
   an antenna module composed of a loop-like antenna formed along near the outer peripheral of one side of a sheet-like board made of resin, and an antenna terminal electrode formed on one side or the other side,
   wherein the mounting module mounting the semiconductor storage element on one side of the wiring board including at least one magnetic body layer is disposed so that the other side of the wiring board is overlaid with the antenna module, and the terminal electrode for antenna connection and the antenna terminal electrode are connected to each other.

8. The semiconductor memory module incorporating antenna of claim 7, wherein the mounting module has the semiconductor storage element and the control semiconductor element mounted on one side of the wiring board.

9. The semiconductor memory module incorporating antenna of claim 7, wherein the mounting module has the semiconductor storage element mounted on one side of the wiring board, and the control semiconductor element mounted on the other side.

10. The semiconductor memory module incorporating antenna of claim 9, wherein the antenna module has an opening larger than the control semiconductor element in the sheet-like board forming the loop-like antenna, and the antenna module is overlaid and disposed on the wiring board of the mounting module so that the control semiconductor element may be contained within the opening.

11. The semiconductor memory module incorporating antenna of claim 7, wherein the mounting module has the semiconductor storage element laminated on one side of the wiring board.

12. The semiconductor memory module incorporating antenna of claim 11, wherein the mounting module has a sub-board mounting the semiconductor storage element laminated on one side of the wiring board.

13. The semiconductor memory module incorporating antenna of claim 7, wherein the antenna module has the loop-like antenna formed on both sides of the sheet-like board, and is connected to the terminal electrode for antenna connection formed on one side or the other sides by way of a lead-through electrode provided on the sheet-like board.

14. The semiconductor memory module incorporating antenna of claims 1 or 7, wherein the wiring board is made of ceramic material or resin material containing magnetic body powder.

15. The semiconductor memory module incorporating antenna of claims 1 or 7, wherein the wiring board includes at least one magnetic body layer made of at least one material selected from Fe, Ni, and Co, and the magnetic body layer is electrically isolated from the via conductors penetrating through the wiring board.

16. The semiconductor memory module incorporating antenna of claims 1 or 7, wherein the magnetic body layer is patterned and formed in a wider area than the region of forming the semiconductor storage element, as seen from the side disposing the antenna.

17. The semiconductor memory module incorporating antenna of claim 7, wherein at least one of an insulating protective layer for protecting the antenna of the antenna module, a sheet-like board for supporting the antenna, and an adhesive layer for adhering the sheet-like board contains magnetic body powder.

* * * * *